United States Patent [19]

Brower

[11] Patent Number: 4,935,090
[45] Date of Patent: Jun. 19, 1990

[54] PHOTOFLASH ARRAY QUICK-CURE LAMINATING PROCESS

[75] Inventor: Boyd G. Brower, Williamsport, Pa.

[73] Assignee: GTE Products Corporation, Danvers, Mass.

[21] Appl. No.: 298,864

[22] Filed: Sep. 3, 1981

[51] Int. Cl.$^5$ .............. B32B 31/26; B65C 9/25; H05K 3/20; H05K 3/02
[52] U.S. Cl. ................ 156/307.3; 156/307.7; 156/322; 29/831; 29/846; 174/259
[58] Field of Search ............. 29/831, 829, 622, 832, 29/834, 835, 846; 174/68.5; 428/901; 156/81, 182, 196, 273, 308.6, 309.9, 321, 261, 323, 583.3, 228, 257, 275.7, 306.9, 307.3, 307.7, 299; 100/211, 295, 296

[56] References Cited

U.S. PATENT DOCUMENTS

| | | | |
|---|---|---|---|
| 2,957,227 | 10/1960 | Scott | 156/323 |
| 2,969,300 | 1/1961 | Franz . | |
| 3,547,724 | 12/1970 | Zagusta | 156/257 |
| 3,940,534 | 2/1976 | Fick et al. | 174/68.5 |
| 3,962,520 | 6/1976 | Watanabe et al. | 428/901 |
| 4,016,021 | 4/1977 | La Fleur | 100/211 |
| 4,078,962 | 3/1978 | Krueger | 100/211 |
| 4,159,921 | 7/1979 | Inohara et al. | 100/211 |
| 4,320,572 | 3/1982 | Brower et al. | 29/622 |
| 4,325,771 | 4/1982 | Brower et al. | 29/829 |

FOREIGN PATENT DOCUMENTS

| | | |
|---|---|---|
| 0025905 | 4/1981 | European Pat. Off. . |
| 1235569 | 5/1960 | France . |
| 1260273 | 3/1961 | France . |
| 1120575 | 7/1966 | United Kingdom . |
| 1456472 | 11/1976 | United Kingdom . |

OTHER PUBLICATIONS

IBM Technical Disclosure Bulletin, vol. 10, No. 8, Jan.-1968, p. 1284-Weikiuger.

Primary Examiner—Michael W. Ball
Assistant Examiner—L. Falasco
Attorney, Agent, or Firm—Martha Ann Finnegan; Thomas H. Buffton

[57] ABSTRACT

A quick-cure laminating process for multi-lamp photoflash arrays includes the application of a curable adhesive to a metallic printed circuit, the positioning of the adhesive-covered printed circuit adjacent a deformable rubber material and a circuit board and the printed circuit and circuit board intermediate a pair of surfaces movable with respect to one another and the moving of said surfaces to exert a compressive force on said printed circuit and circuit board while being heated to a temperature and for a time sufficient to effect attachment of the printed circuit to the circuit board. In another aspect, the circuit board may be of a deformable material, placed in contact with an adhesive-covered printed circuit, compressed and heated to effect attachment of the printed circuit to the circuit board.

10 Claims, 2 Drawing Sheets

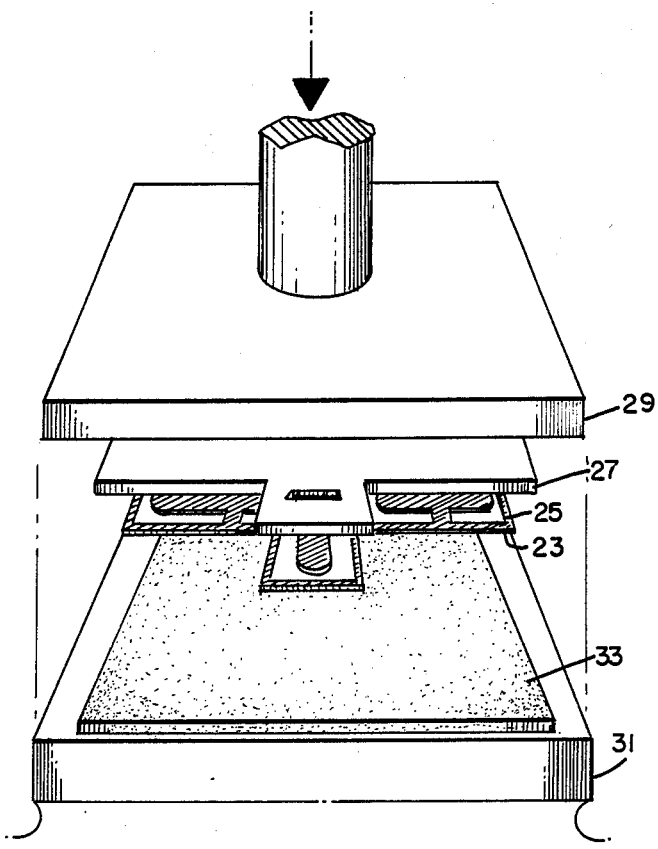
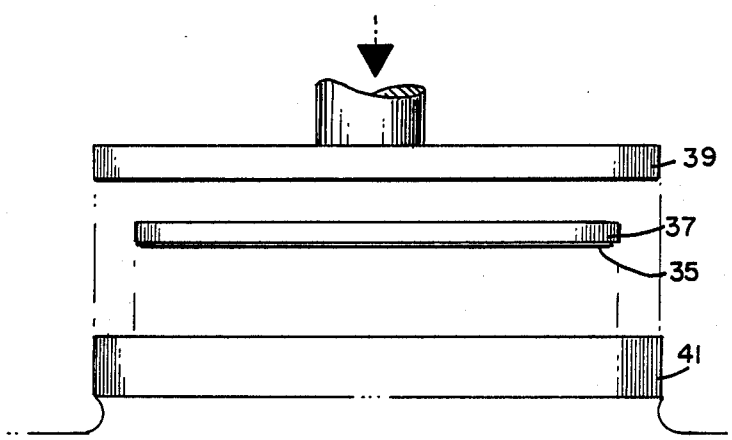

PHOTOFLASH ARRAY QUICK-CURE LAMINATING PROCESS

TECHNICAL FIELD

This invention relates to multi-lamp photoflash arrays and more particularly to a quick-cure laminating process for affixing a metallic circuit to a circuit board.

BACKGROUND ART

In the manufacture of multi-lamp photoflash arrays, it is common practice to employ a circuit board whereon a metallic printed circuit is attached. Frequently this printed circuit is of a material such as aluminum foil and die-stamped to a desired configuration. Moreover, the configured aluminum foil is electrically conductive and provides the electrical conductive paths necessary to the energization of a multi-lamp photoflash array.

Ordinarily, a circuit board of a material such as a glass-filled epoxy serves as a substrate and the metallic printed circuit is affixed thereto. Usually an adhesive material is applied to one surface of the printed circuit and pressure and heat are applied to the circuit and circuit board in an amount sufficient to cure the adhesive and effect attachment of the printed circuit to the circuit board.

At the present time, it is not unexpected to find circuit board material specifications which permit a board thickness variation in the range of about plus or minus ten percent. Because of such relatively great variation in board thickness, it has been found that virtually every circuit board has one or more low spots whereat contact with the adhesive covering the printed metallic circuit is not obtained. This lack of intimate contact between the adhesive-covered printed circuit and the circuit board has been found to greatly inhibit the rate of cure of the adhesive and, of course, causes a great extension of the time required for attachment between the printed circuit and the circuit board. As a result, it has become more or less standard in the laminating of photoflash arrays to compensate for this lack of intimate contact between printed circuit and circuit board by employing a large number of structures cured for a relatively long period of time, such as a minimum of about 15 minutes, for example. However, it is obvious that efficiency and economy are sacrificed when such manufacturing techniques are required.

In another aspect, the attachment of an adhesive-covered printed circuit to a circuit board utilizing a compression force tends to cause an undesired excess adhesive discharge. Thus, it is not uncommon to employ a kraft paper as a blotter to absorb this excess adhesive discharge. However, blotter material is an added cost, especially when replacement is necessary for each curing cycle, and obviously deleterious to an economical manufacturing operation.

OBJECTS AND SUMMARY OF THE INVENTION

An object of the present invention is to provide an improved multi-lamp photoflash array. Another object of the invention is to reduce the time required to fabricate a multi-lamp photoflash array. Still another object of the invention is to enhance the manufacture of multi-lamp photoflash arrays. A further object of the invention is to reduce the time required to laminate a metallic printed circuit and a circuit board utilized in a photoflash array.

These and other objects, advantages and capabilities are achieved in one aspect of the invention by a quick-cure laminating process wherein an adhesive is applied to a metallic printed circuit, the printed circuit and a circuit board are positioned intermediate a pair of surfaces with the surface adjacent the printed circuit being an elastomeric material, compressed and heated for a time and at a temperature sufficient to cure the adhesive and affix the printed circuit to the board.

In another aspect of the invention an adhesive is applied to a metallic printed circuit which, along with a circuit board of elastomeric material, is positioned intermediate a pair of movable surfaces. The movable surfaces compress the printed circuit and circuit board at a pressure and temperature and for a time sufficient to cure the adhesive and affix the printed circuit to the circuit board.

BRIEF DESCRIPTION OF THE DRAWINGS

FIG. 2 is an exploded illustration of a preferred laminating process utilizing heat and compression for fabricating a circuit board with an affixed printed circuit; and FIG. 3 is an alternate laminating process for fabricating printed circuit boards.

BEST MODE FOR CARRYING OUT THE INVENTION

Figure 1:
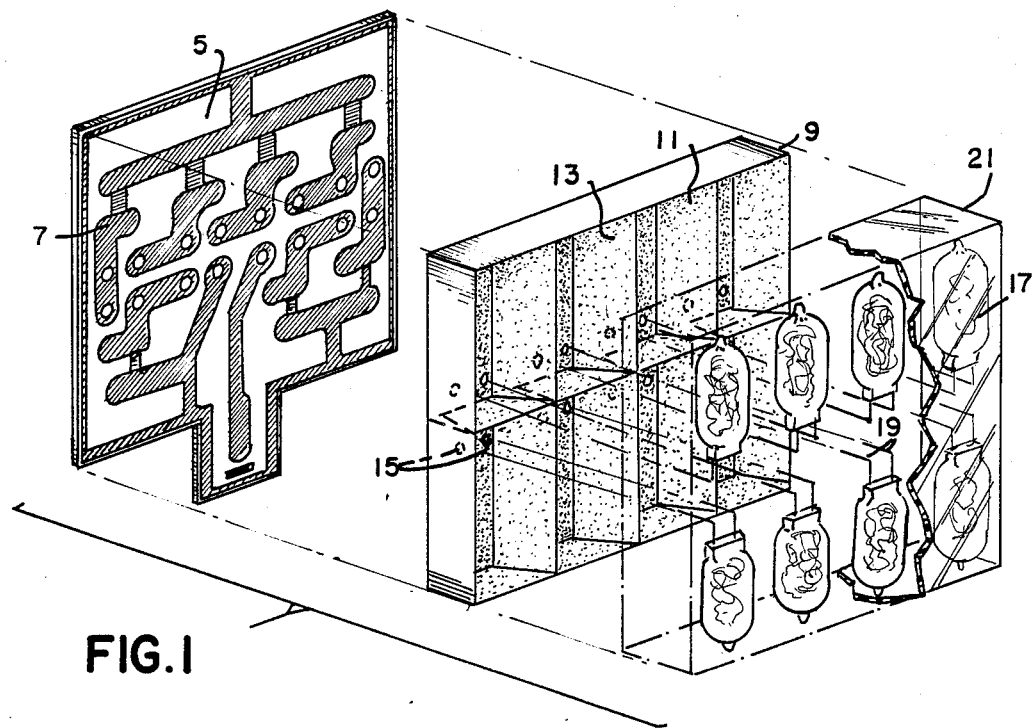
FIG. 1 is an exploded view of a multi-lamp photoflash array utilizing a laminated printed circuit configuration.

For a better understanding of the present invention, together with other and further objects, advantages and capabilities thereof, reference is made to the following disclosure and appended claims in conjunction with the accompanying drawings.

Referring to the drawings, FIG. 1 illustrates a multi-lamp photoflash array. Therein, a circuit board 5 has a metallic printed circuit 7 affixed thereto and is positioned immediately adjacent a reflector unit 9. The reflector unit 9 includes a plurality of aligned cavities 11, each having a reflective surface 13 and a pair of conductor receiving apertures 15.

A photoflash lamp 17 having a pair of electrical conductors 19 is disposed within each one of the cavities 11 with the electrical conductors 19 extending therethrough and contacting the metallic printed circuit 7. A light transmittable plastic housing member 21 encloses the reflector unit 9 and photoflash lamps 17, and is affixed to the circuit board 5. Thus, the printed circuit 7, the reflector unit 9 and the flashlamps 17 are contained intermediate the circuit board 5 and the housing member 21.

As previously mentioned, commonly known techniques for the manufacture of the above-mentioned and other circuit boards and affixed printed circuits are relatively slow, require added materials such as blotter materials and are, therefore, expensive and lacking in efficiency. However, the deficiencies of the above technique are overcome by the following enhanced quick-cure laminating process for multi-lamp photoflash arrays.

Referring to FIG. 2, a quick-cure laminating process includes therein a metallic printed circuit 23 such as may be obtained in a die-stamp operation utilizing an aluminum foil. Obviously, other materials and other techniques for deriving the printed circuit from the material are equally appropriate. Also, a curable adhesive 25 is applied to one surface of the printed circuit 23.

Immediately adjacent the curable adhesive 25 applied to the printed circuit 23 is a printed circuit board 27. The printed circuit board 27 may be of a moldable resin material, a resin-filled glass epoxy or numerous other materials well-known in the printed circuit board field. Moreover, the printed circuit 23 having the curable adhesive 25 thereon and the printed circuit board 27 are all positioned intermediate a pair of surfaces 29 and 31 movable with respect to one another. Moreover, the surfaces 29 and 31 are connected to a heating source (not shown) and to a source of compressive force (not shown).

Positioned on one of the pair of surfaces 29 and 31 and adjacent the printed circuit 23 is a deformable material layer 33. This deformable material layer 33 is of a material such as silicon rubber and, more specifically, of a material such as a fiberglass fabric high temperature elastomeric composite material known as Grade 55392R045, available from the Keene Corporation, Chase-Foster Division, Bear, Del. 19701. Moreover, the above-mentioned elastomeric material is recommended for temperatures up to about 500° F. for a limited period of time.

More specifically, the laminating process includes the application of a curable adhesive 25 to one surface of the metallic printed circuit 23. The adhesive-covered printed circuit 23 is positioned with the adhesive 25 adjacent a circuit board 27. Thereafter, the printed circuit 23 and circuit board 27 are located intermediate the pair of surfaces 29 and 31 which are movable with respect to one another. In addition, the layer of elastomeric material 33 positioned on the surface 31 of the pair of surfaces 29 and 31 is adjacent the printed circuit 23.

Thereafter, the surfaces 29 and 31 are moved toward one another in an amount sufficient to exert a compressive force in the range of about 100 to 500 pounds per square inch on the printed circuit 23 and circuit board 27. Simultaneously, the printed circuit 23 having the adhesive 25 thereon and the circuit board 27 are heated in an amount and for a time sufficient to cause the printed circuit 23 to become affixed to the circuit board 27.

Preferably, the printed circuit 23 and circuit board 27 are heated to a temperature in the range of about 360° to 550° F. Moreover, the heating of the printed circuit 23 and circuit board 27 is effected for a period not greater than about 30 seconds and preferably for a period in the range of about 4 to 20 seconds. Thus, the printed circuit 23 and circuit board 27 are subjected to a compressive force in the range of about 100 to 500 pounds per square inch, a temperature in the range of about 360° to 550° F., and for a period not greater than about 30 seconds.

Alternatively, FIG. 3 illustrates a quick-cure laminating process for multi-lamp photoflash arrays wherein the above-mentioned elastomeric material layer 33 of FIG. 2 is not required. Herein, an adhesive is applied to a surface of a printed circuit 35, and the printed circuit 35 is positioned adjacent a circuit board 37 of a deformable material. A preferred deformable material circuit board 37 is known as "Duroid," manufactured by the Rogers Corporation of Rogers, Conn. 06263.

Thereafter, the printed circuit 35 and circuit board 37 of deformable material are located intermediate a pair of surfaces 39 and 41 which are movable with respect to one another. The surfaces 39 and 41 are activated to exert a compressive force on the printed circuit 35 and circuit board 37 in the range of about 100 to 500 pounds per square inch. Simultaneously, heat is applied to the printed circuit 35 and circuit board 37 in an amount and for a time sufficient to cure the adhesive and effect attachment therebetween.

Specifically, the simultaneous application to the printed circuit 35 and circuit board 37 of compressive force in the range of about 100 to 500 pounds per square inch, at a temperature in the range of about 360 to 500° F. and for a period not greater than about 30 seconds is sufficient to effect the desired attachment. Moreover, the circuit board 37 of deformable material serves to contain the adhesive intermediate the printed circuit 35 and circuit board 37 thereby eliminating the need for a blotter or other forms of adhesive absorbed.

While there has been shown and described what is at present considered the preferred embodiments of the invention, it will be obvious to those skilled in the art that various changes and modifications may be made therein without departing from the invention as defined by the appended claims.

INDUSTRIAL APPLICABILITY

An enhanced quick-cure laminating process for multi-lamp photoflash arrays has been provided wherein a metallic printed circuit is attachable to a circuit board in a period of less than about 30 seconds. The process not only provides a very great reduction in cycle time required to effect such a printed circuit-circuit board attachment, but also provides an obvious improvement in manufacture and manufacturing cost. Moreover, the utilization of a deformable material in the manufacturing process virtually eliminates the need for blotter materials for absorbing excess adhesives which, in turn, further reduces materials and material costs.

I claim:

1. A quick-cure laminating process for a multi-lamp photoflash array comprising the steps of applying a curable adhesive to one surface of a metallic printed circuit;
   then positioning said metallic printed circuit and a printed elastomeric circuit board intermediate a pair of spaced surfaces movable with respect to one another;
   moving said spaced surfaces to provide intimate contact between said metallic printed circuit and said printed elastomeric circuit board and
   heating said contacting metallic printed circuit and said printed elastomeric circuit board to a temperature and for a time sufficient to cure said adhesive and affix said metallic printed circuit to said printed elastomeric circuit board.

2. The quick-cure laminating process of claim 1 wherein said heating of said metallic printed circuit and said printed elastomeric circuit board is at a temperature in the range of about 360° to 550° F.

3. The quick-cure laminating process of claim 1 wherein said heating of said metallic printed circuit and said printed elastomeric circuit board is for a period not greater than about 30 seconds.

4. The quick-cure laminating process of claim 1 wherein said heating of said metallic printed circuit and said printed elastomeric circuit board is at a pressure in the range of about 100 to 500 pounds per square inch.

5. In a quick-cure laminating process wherein a metallic circuit has an adhesive on one surface, a printed circuit board is positioned adjacent said adhesive-covered surface of said circuit, said circuit and circuit board are positioned intermediate a pair of surfaces movable with respect to one another with one surface of said pair of surfaces being adjacent said metallic circuit, and said surfaces are moved to exert a pressure between said printed circuit board and said circuit, the improvement comprising: heating said metallic circuit and printed circuit board, wherein said printed circuit board is elastomeric, under said pressure to a temperature and for a for a period not greater than about 30 seconds to cure said adhesive and affix said metallic circuit to the elastomeric printed circuit board.

6. The improvement of claim 5 wherein said metallic circuit and printed elastomeric circuit board are heated to a temperature in the range about 360° to 550° F.

7. The improvement of claim 5 wherein said pressure exerted on said metallic circuit and printed elastomeric circuit board during said heating is in the range of about 100 to 500 pounds per square inch.

8. The improvement of claim 5 wherein said pressure exerted on said metallic circuit and printed elastomeric circuit board is in the range of about 100 to 500 pounds per square inch, and said temperature is in the range of about 360° to 550° F.

9. The improvement of claim 5 including the step of preheating said printed elastomeric circuit board prior to said exertion of pressure on and heating of said metallic circuit and printed circuit board.

10. The improvement of claim 7 wherein the printed elastomeric circuit board is "Duroid".

* * * * *